United States Patent [19]
Smith et al.

[11] Patent Number: 5,889,435
[45] Date of Patent: Mar. 30, 1999

[54] ON-CHIP PLL PHASE AND JITTER SELF-TEST CIRCUIT

[75] Inventors: Larry D. Smith, San Jose; Norman E. Abt, Menlo Park, both of Calif.

[73] Assignee: Sun Microsystems, Inc., Palo Alto, Calif.

[21] Appl. No.: 884,694

[22] Filed: Jun. 30, 1997

[51] Int. Cl.[6] ........................................... H03L 7/06
[52] U.S. Cl. ............................ 331/1 A; 331/12; 331/14; 331/16; 331/44; 375/226; 375/376
[58] Field of Search ................................ 331/1 A, 11, 12, 331/14, 16, 44; 375/226, 376

[56] References Cited

U.S. PATENT DOCUMENTS 5,381,085   1/1995   Fischer ....................................... 331/44
5,663,991   9/1997   Kelkar et al. ............................. 375/376

*Primary Examiner*—Siegfried H. Grimm
*Attorney, Agent, or Firm*—Flehr Hohbach Test Albritton & Herbert LLP

[57] ABSTRACT

An ASIC includes a PLL and digital circuitry to quantize and measure phase and average maximum jitter between a system clock input to the PLL, and a PLL-generated clock signal. The system clock is input to a series-string of delay elements, each contributing a delay of about $1\Delta t$. Each delay element is associated with a two-input logic element, such as an EX-OR gate or an EX-NOR gate. One input to each two-input logic element is a version of the PLL-generated clock delayed by about $(N/2) \Delta t$. The second input to the first EX-OR is the output from the first delay element, the second input to the first EX-NOR is the output from the second delay element, and so on. Whichever delay element outputs a signal most closely in phase with the delayed PLL-generated clock will have an associated two-input logic element signal with a minimum duty cycle. Each two-input logic element output signal is capacitor integrated, sampled, stored and digitized. The digitized output signal identifies the lowest duty cycle two-input logic element, and thus phase shift. The relative breadth of the integrated capacitor voltage profile provides a measure of average maximum jitter.

20 Claims, 3 Drawing Sheets

ON-CHIP PLL PHASE AND JITTER SELF-TEST CIRCUIT

FIELD OF THE INVENTION

This invention relates to phase lock loop clock generators in general, and to methods and devices for measuring phase offset and phase jitter in the output signal from such generators.

BACKGROUND OF THE INVENTION

Many systems, including computer systems, must provide a generated clock signal that is synchronized to an input system clock signal that is generated externally. Phase lock loop ("PLL") technology is commonly used in this process. The system clock signal is input to a PLL, which generates the generated clock signal and then substantially locks its phase and frequency to a multiple of the system clock signal using feedback. FIG. 1A depicts a generic PLL circuit 10, comprising a phase detector 20, a loop filter 30, voltage controlled oscillator ("VCO") 40, and a digital divide-by-N unit 50.

A system clock signal is input to the non-inverting input of phase detector 20, and a clock signal output from the frequency divider 50 is input to the inverting input. The phase detector compares the phase of the two clock signals and generates an output error signal that is proportional to the phase difference, or offset. The error signal from the phase detector is then filtered by loop filter 30 to remove high frequency components. The filtered voltage from the output of the loop filter is then input to VCO 40, which outputs a frequency proportional to the voltage at the VCO input. Thus, VCO 40 will output a generated clock signal whose frequency is proportional to the filtered phase error signal. The VCO output signal is fed back through an optional frequency divider 50, which optionally divides the frequency by a number N. The frequency-divided clock signal is then input to the inverting input of the phase detector. For ease of illustration in FIGS. 1B, 1C,1D, it will be assumed that N=1 in divider 50, e.g., that the generated clock and the system clock have the same frequency. However, a common frequency for these two clock signals is not required for the present invention.

The quality of the generated clock signal is measured in terms of a system phase (or time) offset and jitter with respect to the system clock. For example, comparing FIGS. 1B and 1C, it is seen that some phase shift error (denoted as phase offset $\phi$) will exist between the system clock signal and the generated clock signal. Ideally, there would be zero error, which would represent a perfect state of synchronization. Although the waveform of FIG. 1C is shown lagging the waveform of FIG. 1B by phase shift $\phi$, the FIG. 1C waveform might instead lead the waveform of FIG. 1B by a phase amount $\phi$.

In an actual PLL system, the magnitude of $\phi$ will vary with time, and the variation can go from lead-to-lag and vice versa as a function of time. Conventionally, The variation of $\phi$ with time (t) is commonly known as jitter, i.e., jitter=$d\phi/dt$. Of importance to the present invention is not so much $d\phi/dt$, but rather the maximum deviation of $d\phi$. As used herein, jitter shall refer to the spread of maximum deviation in values of $d\phi$, without respect to time. Ideally, the magnitude of $\phi$ is small, e.g., very close to zero, and the amount of jitter (e.g., maximum deviation) would be very small if not zero. In FIG. 1D, the system clock, shown with bold lines, is superimposed upon the generated clock, in which jitter occurs on both sides of $\phi=0$. Jitter could in fact exist solely on the positive or negative side of $\phi=0$.

It is difficult to ensure that a generated clock signal will have small magnitude of $\phi$ and small, if not zero, jitter. It is therefore necessary to measure $\phi$ and the average $d\phi$ so that PLL clock generators that are out of specification can be rejected. In some instances, if the average maximum $d\phi$ is within an acceptable range and if $\phi$ is known, the effective magnitude of $\phi$ might be reduced by compensation.

Unfortunately, in practice it is difficult and time consuming to measure $\phi$ and especially to measure deviation in maximum average $d\phi$. Typically measurements of phase shift are made over time using sophisticated and expensive analog laboratory equipment, whereupon $\phi$ and average maximum $d\phi$ may be approximated, subject to potentially substantial inaccuracies. Once these data are known, a measured PLL generator is either passed with respect to meeting $\phi$ and $d\phi$ specification, or is rejected and perhaps discarded. In some instances, measured PLL generators may be marked with the measured $\phi$ and $d\phi$ data for possible use in applications for which the measured amounts of phase and jitter are acceptable.

In summary, there is a need for a rapid and straightforward apparatus and method of testing PLL generators for phase and jitter. Preferably such testing should be capable of implementation on the integrated circuit containing the PLL generator. Further, such testing should be digital in nature, rapidly executing, and accurate in the reported results. In such an implementation, the PLL generator should optionally be able to compensate itself for excessive phase error, assuming that measured jitter is within an acceptable tolerance. On-IC generated measurement data for phase and/or jitter should be available to external digital equipment to permit marking the PLL generator for potential future, other, applications for which the observed phase and jitter may be acceptable.

The present invention provides such a method and apparatus.

SUMMARY OF THE PRESENT INVENTION

In a first aspect, the present invention provides self-test circuitry to quantize phase and maximum average phase jitter for a PLL clock generator, the circuitry being fabricated on the same integrated circuit ("IC") containing the PLL clock generator. The quantizing circuitry includes a plurality of N series-coupled delay elements, preferably logic gates. Each delay element has a common time delay $\Delta t$ (and common delay tolerance). The output of the first delay element delays the system clock by $1\Delta t$, the output of the second delay element delays the system clock by $2\Delta t$, and so forth. The PLL-generated clock signal preferably is delayed by at least one output delay element to provide an equivalent net system clock signal delay of $(N/2) \Delta t$.

Thus, the system clock signal is input to the first delay element, whose output will lag the system clock signal by time or phase delay $1\Delta t$. This once-delayed signal is then input to the second delay element, where an additional unit delay $\Delta t$ is imposed, or a total delay of $2\Delta t$. As the system clock signal passes through successive delay elements, incremental time or phase delay is added until the output of the Nth delay element lags the system clock signal by $N\Delta t$. The number (N) of delay elements required when fabricating the self-test circuitry is determined by the maximum anticipated phase shift $\phi$ magnitude for the PLL, and by the incremental delay $\Delta t$ associated with each delay element. The $(N/2) \Delta t$ output delay-creating element essentially centers the delayed system clock signal within the middle of possible incremental delays available from the series of delay elements.

On average, the (N/2) Δt delayed generated clock will lead or lag the system clock by a phase φ, measured in ps, which phase can vary rapidly with time, e.g., jitter with time such that dφ/dt is not a constant. The time-delayed output from one (e.g., the Xth) of the N series-coupled delay elements will be closer in phase to the system clock than will the delayed output from any other delay element. (There will be a tolerance of about ±Δt/2 on the measurement as it is not known whether matching occurs at the low end, the middle range, or the upper end of the delay provided by the Xth delay element.) Stated differently, one delay element output (the output from delay X) will exhibit the smallest magnitude of phase shift φ. For example, if the output of the second delay element has the smallest magnitude of φ, then the average phase shift between the (N/2) Δt delayed generated clock and the system clock will be approximately two unit delays, or 2Δt.

The present invention further includes a logic unit that identifies the delay element (X) associated with minimal magnitude φ. Once the Xth delay element is identified, the associated phase shift delay φ will be known. The logic unit is coupled to receive the (N/2) Δt delayed generated clock signal, as well as the various incrementally-delayed system clock signals, available from the string of delay elements. The logic unit preferably comprises a plurality of two-input exclusive OR gates ("EX-OR") and a plurality of two-input exclusive-NOR ("EX-NOR") gates. (EX-OR and EX-NOR gates are used as every other delay element output will be inverted if logic inverters are used as delay elements.) The first EX-OR receives as input the delayed (e.g., by about (N/2) Δt) generated clock signal from the PLL, and the output of the first inverter (which is to say the system clock signal plus a phase shift Δt). The input to the first EX-NOR is the delayed PLL generated clock signal, and the output of the second inverter (which is to say the system clock signal plus a phase shift 2Δt). The remaining EX-ORs and EX-NORs are similarly coupled, with odd-numbered delay elements being coupled to EX-ORs and even-numbered delay elements being coupled to EX-NORs. (Alternatively, odd-numbered delay elements could be coupled to EX-NORs, and even-numbered delay elements could be coupled to EX-ORs.) Alternatively, if non-inverting delay elements were used, the logic unit could comprise all EX-ORs.

The output from each EX-OR or EX-NOR is a pulse train whose duty cycle varies with the relative phase shift between the delayed PLL generated clock and the delay element-delayed system clock. As φ decreases, EX-OR and EX-NOR output duty cycle decreases. The smallest duty cycle EX-OR or EX-NOR output pulse train will be associated with the delay element in the string of delay elements whose output is mostly closely in phase with the system clock. Each EX-OR or EX-NOR output signal is capacitor integrated and then periodically sampled after a number of clock cycles, perhaps one hundred cycles. The sampled voltages are preferably stored in a register, and are digitized, e.g., with an analog-to-digital ("A/D") converter. The A/D data identifies the lowest magnitude EX-OR or EX-NOR output signal. This identifies the number of delay elements associated with that lowest magnitude signal to be determined, which gives the magnitude of φ. By sampling the stored register contents as a function of time, a measure of the average breadth or narrowness of dφ is attained, a narrower dφ indicating less jitter. The A/D output may be coupled to a specification threshold check circuit that determines whether the PLL passes specification or not, and can output a GO/NO GO signal. Finally, the A/D output may be coupled back to a phase-varying element in the feedback loop of the PLL to provide a measure of compensation, to reduce φ.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 1A:
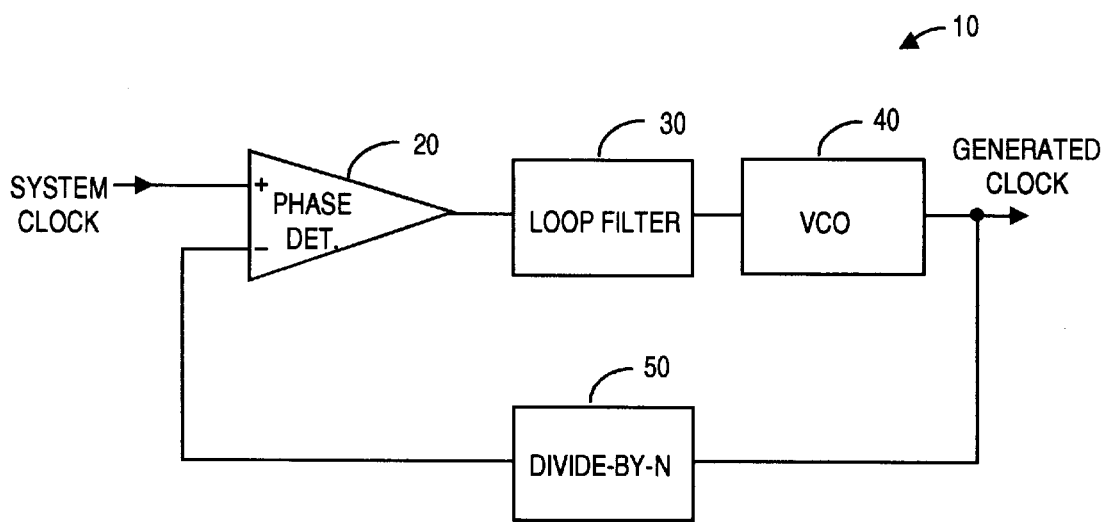
FIG. 1A depicts a generic PLL clock generator, according to the prior art.
Figure 1B:
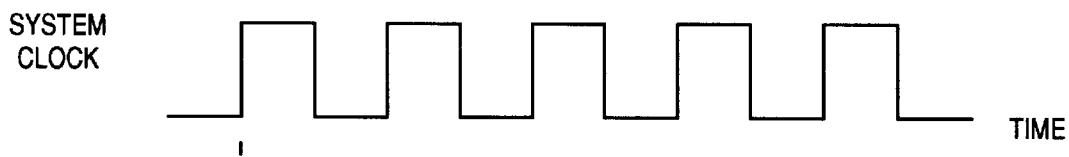
FIGS. 1B and 1C depict, respectively, system clock and generated clock signals and phase shift φ for the generator of FIG. 1A.
Figure 1C:
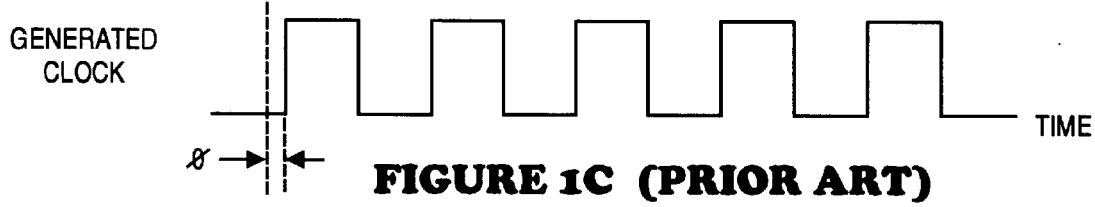
Figure 1D:
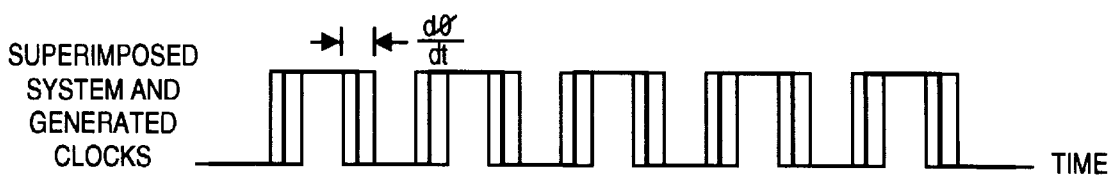
FIG. 1D depicts a superimposition of system clock and generated clock signals, and depicts jitter dφ/dt, for the generator of FIG. 1A.
Figure 2:
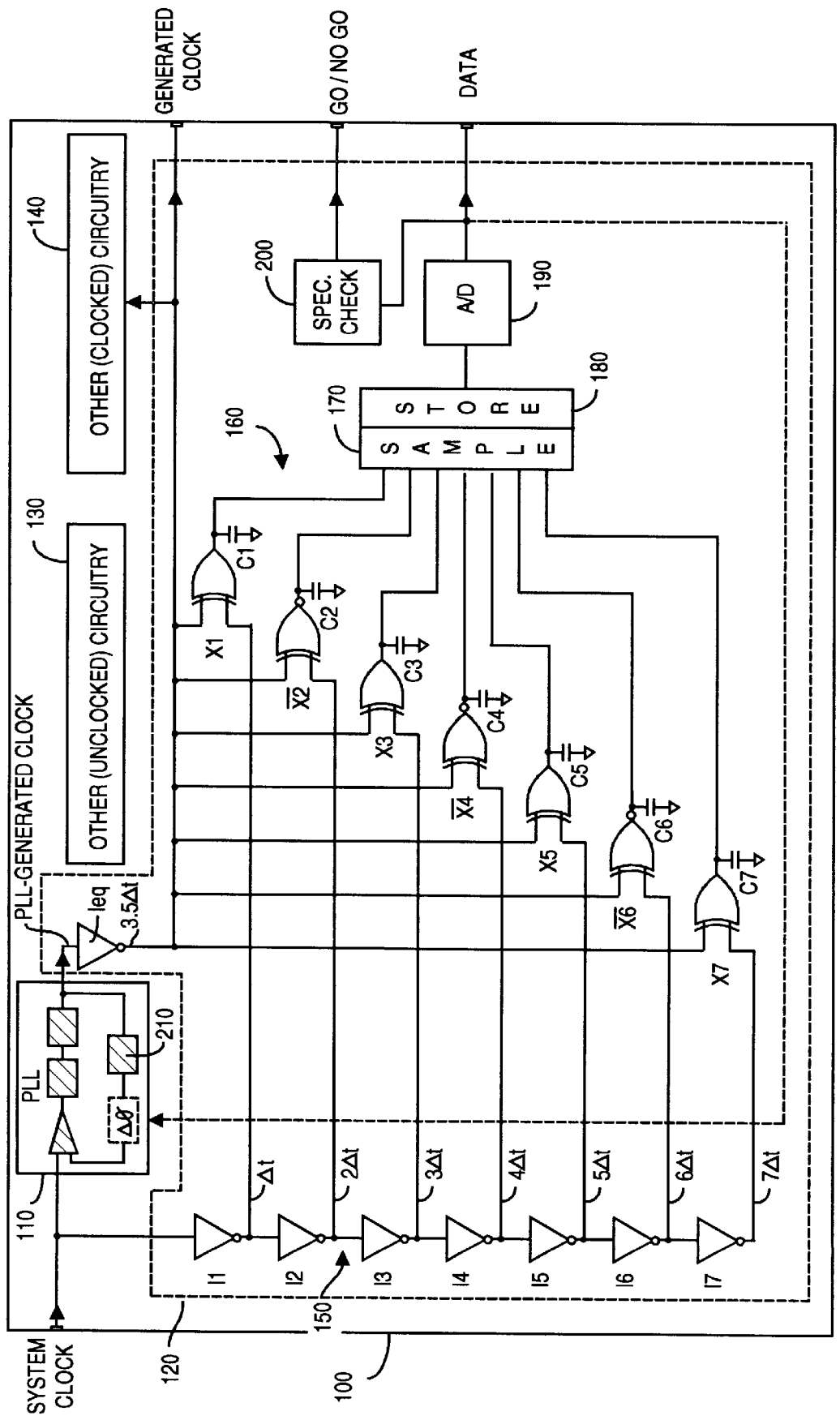
FIG. 2 depicts an IC including a PLL clock generator and a phase shift and jitter self-test circuitry, according to the present invention.

FIG. 2 depicts an integrated circuit ("IC") 100 that includes a PLL generator 110, phase and a phase shift and jitter self-test measurement circuitry 120, according to the present invention. The shaded components within PLL 110 may be identical to what was shown in FIG. 1, e.g., a phase comparator, a loop filter, a VCO, and a frequency divider. (Optional PLL element 210 will be described later herein.) PLL generator 110 receives a system clock signal and outputs a synchronized PLL-generated clock signal, which as noted, will typically have a phase shift φ and jitter or average deviation dφ relative to the system clock signal. Of course IC 100 may also include other circuits 130, 140, some of which may be coupled to the generated clock signal. Indeed, IC 100 may be an application specific IC ("ASIC") and may include substantial circuitry beyond circuitry 120. It is the purpose of circuitry 120 to measure and quantize phase shift and average jitter for PLL generator 110. Further, circuitry 120 makes known its data both to off-chip digital equipment (not shown), and optionally to on-chip circuitry 200 and/or 210.

The present invention 120 preferably includes a series-coupled string 150 of N substantially identical delay elements, here shown as logic gate inverters I1, I2, I3, . . . I7. For ease of illustration, there are N=7 delay elements shown in FIG. 2, but the actual number of implemented delay elements may be other than seven, as described below. By substantially identical it is meant that as closely as possible, each delay element has the same delay from its input to its output. In practice, however, there will be a tolerance associated with such delay. (Alternatively, a continuous delay line-like element could be provided with appropriate taps to create the incrementally increasing delays, but use of standard logic gates is preferred.)

Each delay element (hereafter, inverter) is characterized by a time delay from inverter input to inverter output of Δt, typically perhaps 50 ps ±20% for a system in which the generated clock has a preferably fixed frequency in the range of about 83 MHz to about 600 MHz. Thus, in FIG. 2, Δt is shown by the output of the first delay element I1, 2Δt is shown by the output of the second delay element I2, and so on.

The maximum delayed version of the system clock will be N∆t, which will appear in FIG. 2 at the output of the Nth, or seventh delay element I7. To somewhat center the PLL-generated clock signal in time, a delay element Ieq that contributes a delay approximately (N/2) ∆t is preferably inserted in series with the output of PLL generator 110. The purpose of this delay element is to insert a delay equivalent to about the middle range of delay available from the series-string of delay elements 150. For example, Ieq might be implemented as a string of (N/2) delay elements, each identical to I1, I2, . . . or In.

When PLL 110 is designed, it is possible to predict approximately a worst case phase shift margin, for example 600 ps. The maximum number of delay elements in string 150 is selected to be such that the accumulated delay through string 150 is at least as great as the predicted worst case phase shift margin. For example, if the anticipated margin is 600 ps, and each delay element contributes a unit delay (∆t) of about 50 ps, then the minimum number of delay elements would be 600/50 or 12. Thus, when circuitry 120 is fabricated, string 150 would contain 12 or more delay elements.

If Ieq indeed centers the delay in the PLL-generated clock, it is apparent that the delayed system clock signal from some of the delay elements, e.g., I1, I2 may precede the (N/2) ∆t delayed signal from Ieq. It is also apparently that some of the delay elements, perhaps I6, IN will lag the Ieq delayed signal. Significantly, some or at least one of the delay element output signals will be very close in phase to the Ieq delayed signal. It is a function of circuit 100 to identify that delay element, denoted delay element X. Once that delay element is identified, then the relative phase lag will be known for PLL 110.

Circuit 120 includes a logic unit 160 that preferably comprises two-input EX-OR gates and two-input EX-NOR gates, the total number of these gates adding up to N. If N is even, preferably the number of EX-OR gates and EX-NOR gates is each (N/2). If N is odd, there will be one more or one less EX-OR gate than EX-NOR gates, depending upon the implementation. If the delays are created by inverters, every other delay output will be phase inverted, and an EX-NOR is used to compensate for inversion on the inverted delayed signals.

A first input to each EX-OR gate (e.g., X1, X3, X5, X7), and to each EX-NOR gate (e.g., $\overline{X2}, \overline{X4}, \overline{X6}$) is the (N/2) ∆t delayed PLL-generated clock signal from Ieq. The second input to the first EX-OR gate (X1) is the 1∆t delayed system clock signal from I1. The second input to the first EX-NOR gate ($\overline{X2}$) is the 2∆t delayed system clock signal from I2. The second input to the second EX-OR gate (X3) is the 3∆t delayed system clock signal from I3, and so on, as shown in FIG. 2. If desired, however, the EX-OR gates could be replaced with the EX-NOR gates, and vice-versa.

It is seen that there is associated with each EX-OR gate or each EX-NOR gate in logic unit 160 a single one of the incremental delayed signals from the series-coupled delay elements. For example, the first EX-OR gate X1 is associated with first delay element I1 in that the output of I1 is an input to X1. First EX-NOR gate $\overline{X2}$ is associated with second delay element I2 in that the output of I2 is an input to X2, and so on.

It is apparent from FIG. 2, that successively more delay is added to the delay element output signals as one progresses down the series-coupled string 150. If ∆t is 50 ps, then the output of I1 will lag the system clock by 50 ps, the output of I2 will lag the system clock by 100 ps, etc. The output of one of the delay elements I1 . . . IN will be closest in phase to the (N/2) ∆t delayed PLL-generated clock signal. If the delayed PLL-generated clock signal has an average phase shift φ of, say, 165 ps, then the I3 output signal, with its 150 ps lag, would be the closest match to the delay between the generated clock and the system clock. However, since it would not be known whether the closest delay match to I3 was barely met at the low or high end of the I3 delay, or was met by the center range of I3, there will be a quantization error of about ±25 ps (e.g., half the unit delay of 50 ps, in this example).

The output of an EX-OR gate is high only when a single input is high, and is low otherwise. The output of an EX-NOR gate is a complement, in that its truth table is opposite to that of an EX-OR gate, however one input to the EX-NOR will be an inverted delay. Thus, if the two inputs to an EX-OR or an EX-NOR were precisely in phase, the duty cycle of the EX-OR or EX-NOR output would be zero. Accordingly, whichever of X1, X2, . . . XN has the lowest output signal duty cycle will be associated with the delay element whose output has an accumulated delay closest to the phase shift between the generated clock and the system clock. If the average phase shift between the generated clock and the system clock were 165 ps, then (per the above example), X3 would have the lowest output duty cycle, as it is associated with I3.

The output signal of each EX-OR and EX-NOR preferably is integrated, for example by shunting a capacitor across each EX-OR output and to ground. The integrated signal will provide a measure of the duty cycle, e.g., pulse width, of each output signal. In FIG. 2, each of capacitors C1, C2, . . . CN is about 100 pF in magnitude. After a number of clock cycles, perhaps 100 cycles although the number can be changed, each capacitor will have charged up to some average measurable voltage, preferably about half the magnitude of a "high" digital output signal from an EX-OR or EX-NOR gate. The capacitor integrated voltages are coupled to a sampler unit 170 whose output signals may be coupled to a register or store unit 180, and also to an analog-to-digital (A/D) converter 190.

By sampling first C1, then C2, C3 and so on, A/D 190 can learn which capacitor is holding the smallest average charge, or voltage magnitude. If C3 is so identified, then the I3 output (referred to as the I-Xth output) represents the closest approximation to the average phase shift between the delayed PLL-generated clock and the system clock. In this instance, the phase shift would be quantized to a nominal value of about −25 ps, e.g., the difference between accumulated time delay (3∆t) or 150 ps associated with the I3 output signal, and the Ieq delay of about 175 ps. However, a ±25 ps error value must also be taken into consideration in the quantizing process. Note that the nominal −25 ps (0 ps to −50 ps, with error) means the I3 output lags 25 ps behind the delayed PLL-generated clock signal. The phase differential could in fact lead or lag, and it is the inclusion of Ieq that provides this additional flexibility with respect to identifying magnitude and lead or lag relationship of the phase delay.

Figure 3A:
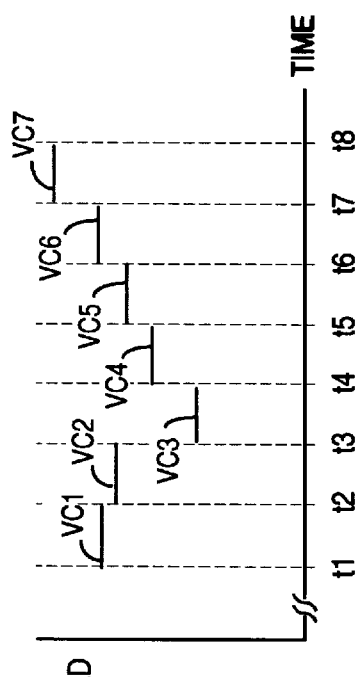
FIGS. 3A and 3B depict sampled capacitor integrated voltages for respective large and small jitter test results, according to the present invention.
Figure 3B:
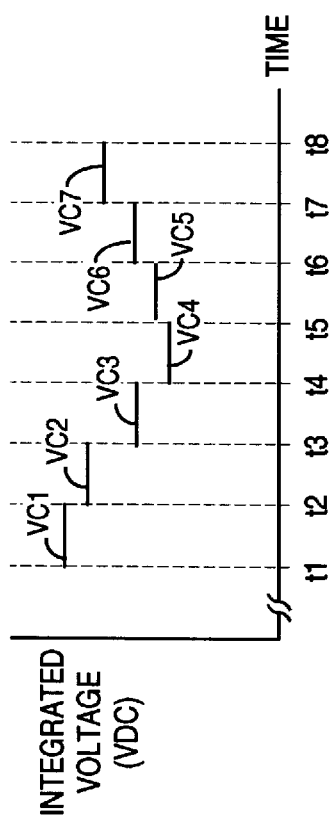

FIGS. 3A and 3B depict integrated voltages after a number of clock cycles that might be seen across each of integrating capacitors C1, C2, . . . CN. If the logical high level of the EX-OR or EX-NOR logic is say 2 VDC, then the various capacitors will be allowed to integrate over a sufficient number of clock cycles (perhaps 100 cycles or more) such that an average voltage of perhaps 1 VDC can be attained by the highest integrating capacitor.

In FIG. 3A, capacitor C4 has a lowest magnitude voltage denoted VC4, and thus EX-NOR $\overline{X4}$ is coupled to the delay element whose output phase shift most closely approximates the generated clock to system clock phase shift. In this instance, the delay element is I4, whose output is delayed 4Δt or perhaps 200 ps relative to the system clock. Thus, the D/A sampled voltages shown in FIG. 3A indicate that the quantized phase shift associated with PLL 100 is about +25 ps, or the difference between 200 ps delay from I4 and about 175 ps delay from Ieq. (Again, more realistically a +25 ps error must be assumed.) Note that in FIG. 3B, the lowest integrated voltage is associated with capacitor C3, and thus the quantized phase shift associated with PLL is about −25 ps, e.g., the difference between 150 ps from I3 and 175 ps from Ieq. FIGS. 3A and 3B also provide information as to relative average jitter, e.g., maximum deviation in dφ.

Note that a plot of voltage profiles across FIG. 3A has a relatively broad shape, similar to the letter "U". By contrast, the plot of voltage profiles across FIG. 3B has a narrow shape, more similar to the letter "V". A PLL whose data are represented by FIG. 3B has less jitter than a PLL whose data are represented by FIG. 3A. Ideally, if jitter were zero, the voltage on capacitors to the "left" and "right" of the minimum voltage capacitor (e.g., capacitors associated with less or more delay time) would each have voltages that increased in linear fashion. Jitter, however, would be evidenced by more random (or non-linear) voltage levels on capacitors to the left and right of the minimum voltage capacitor. Further, as shown by FIG. 3B, jitter is evidenced by a minimum voltage that is spread out broadly over several capacitors, again non-linearly.

The A/D output data may be coupled off-chip to external, typically digital, test equipment. Using the A/D provided data, a technician may then learn average magnitudes of φ and dφ/dt for the IC at hand. Using this information, the technician can then provide a calibration sticker or a mark to be affixed to IC 100. So marked, it can then be determined for what applications IC 100 is suited.

The A/D output may be coupled to an on-chip specification checking circuit 200 that compares the lowest digital output signal from A/D 190 with pre-stored threshold signal limits representing worst case acceptable phase magnitudes for a PLL. If the A/D data for PLL 100 falls within acceptable magnitudes, as determined by circuit 200, circuit 200 can output a signal that is a "GO", e.g., PLL 110 is acceptable for the task at hand. Otherwise, circuit 200 will output the complementary or another signal that represents a "NO GO", e.g., do not use this IC for the originally intended purpose.

Because A/D 190 can output a signal representing a quantization of measured phase shift between the generated clock signal and the system clock signal, the A/D output signal may be used to compensate for that phase shift. As shown in FIG. 2, PLL 110 may include a phase-varying element 210 in its feedback loop, such that element 210 varies phase shift in response to the A/D output signal, to reduce phase shift.

It will be appreciated that the present invention can reduce the cost and reduce the time associated with testing phase and jitter in ASICs containing PLL circuits. As such, the system level timing constraints associated with such ASICs can have tester guardband components reduced, as more reliable and accurate test data are made available. In turn, such ASICs may then be allowed to operate reliably at even faster clock rates.

Modifications and variations may be made to the disclosed embodiments without departing from the subject and spirit of the invention as defined by the following claims.

What is claimed is:

1. A circuit for testing at least phase shift (φ) between a system clock signal input to a phase lock loop (PLL) and a PLL-generated clock signal output by said PLL, the circuit comprising:

N series-coupled delay elements that each contribute a time delay Δt to a signal passing through each of said elements, a first one of said delay elements having an input port coupled to receive said system clock signal and outputting a replica of said system clock signal delayed by said Δt, an Nth one of said delay elements having an input port coupled to receive an output from an (N−1)th one of said delay elements and outputting a replica of said system clock signal delayed by NΔt;

a delay circuit, coupled to said PLL-generated clock output signal, that contributes a delay approximately (N/2) Δt and outputs a delayed PLL-generated clock output signal;

N two-input logic gates, each having a first input coupled to receive said delayed PLL-generated clock signal, and each having a second input coupled to receive an output of an associated said one of said delay elements;

wherein each of said two-input logic gates outputs a signal whose duty cycle is proportional to phase shift between signals present at inputs of each logic gate; and circuitry coupled to said outputs of said two-input logic gates to determine which one of said outputs has a minimum duty cycle, a minimum duty cycle output being associated with an Xth one of said two-input logic gates;

wherein a quantized measure of said φ is given by (N/2−X) Δt.

2. The circuit of claim 1, wherein said PLL and said circuit are each fabricated on a same integrated circuit.

3. The circuit of claim 1, wherein each of said delay elements is a logic gate.

4. The circuit of claim 1, wherein said two-input logic gates include two-input exclusive-or logic gates and two-input exclusive-nor logic gates.

5. The circuit of claim 1, wherein said circuitry integrates each output signal from each of said two-input logic gates.

6. The circuit of claim 1, further including a shunt capacitor coupled across an output of each of said two-input logic gates so as to integrate an output signal thereat.

7. The circuit of claim 5, wherein said circuitry further includes a sampler coupled to sample each output signal from each of said two-input gates.

8. The circuit of claim 7, wherein said circuitry further includes an analog-to-digital converter (A/D) coupled to an output of said sampler.

9. The circuit of claim 7, wherein said circuitry further includes a register coupled to store sampled output signals from said two-input gates;

wherein a scan of said sampled output signals as a function of time provides a measure of jitter (dφ/dt) associated with said generated clock signal.

10. The circuit of claim 8, further including a specification check circuit, coupled to receive an output of said A/D converter, and to compare data from said output of said A/D converter with pre-stored data to signal whether at least one of said φ and maximum average dφ meet specification for said PLL.

11. The circuit of claim 8, wherein said PLL includes a phase-varying element coupled to an output of said A/D converter;

wherein said φ is reduced by said phase-varying element in response to an output signal from said A/D converter.

12. An integrated circuit (IC) including:
a phase lock loop (PLL) coupled to received a system clock signal and to generate therefrom a synchronized PLL-generated clock output signal having a phase shift (φ) relative to said system clock signal;
a circuit for testing at least said φ, comprising:
N series-coupled delay elements that each contribute a time delay Δt to a signal passing through each of said elements, a first one of said delay elements having an input port coupled to receive said system clock signal and outputting a replica of said system clock signal delayed by said Δt, an Nth one of said delay elements having an input port coupled to receive an output from an (N−1)th one of said delay elements and outputting a replica of said system clock signal delayed by NΔt;
a delay circuit, coupled to said PLL-generated clock output signal, that contributes a delay approximately (N/2) Δt and outputs a delayed PLL-generated clock output signal;
N two-input logic gates, each having a first input coupled to receive said delayed PLL-generated clock signal, and each having a second input coupled to receive an output of an associated said one of said delay elements;
wherein each of said two-input logic gates outputs a signal whose duty cycle is proportional to phase shift between signals present at inputs of each logic gate; and
circuitry coupled to said outputs of said two-input logic gates to determine which one of said outputs has a minimum duty cycle, a minimum duty cycle output being associated with an Xth one of said two-input logic gates;
wherein a quantized measure of said φ is given by (N/2−X) Δt.

13. The IC of claim 12, wherein each of said delay elements is a logic gate.

14. The IC of claim 12, wherein each of said two-input logic gates includes a logic unit selected from the group consisting of (a) a two-input exclusive-or logic gate, and (b) a two-input exclusive-nor logic gate.

15. The IC of claim 12, further including:
a shunt capacitor coupled across an output of each of said two-input logic gates so as to integrate an output signal thereat;
a sampler coupled to sample each output signal from each of said two-input gates; and
an analog-to-digital converter (A/D) coupled to an output of said sampler;
wherein an output signal from said A/D converter provides a measure of said φ.

16. The IC of claim 15, further including a register coupled to store sampled output signals from said two-input gates;
wherein a scan of said sampled output signals as a function of time provides a measure of average maximum jitter dφ associated with said generated clock signal.

17. The IC of claim 15, further including a specification check circuit, coupled to receive an output of said A/D converter, and to compare data from said output of said A/D converter with pre-stored data to signal whether at least one of said φ and dφ meet specification for said PLL.

18. The IC of claim 15, wherein said PLL includes a phase-varying element coupled to an output of said A/D converter;
wherein said φ is reduced by said phase-varying element in response to an output signal from said A/D converter.

19. A method for measuring at least phase shift (φ) between a system clock input to a phase lock loop (PLL) and a synchronized PLL-generated clock output signal from said PLL, said PLL being fabricated on an integrated circuit (IC), the method comprising the following steps:

(a) providing on said IC N series-coupled delay elements that each contribute a time delay Δt to a signal passing through each of said elements, a first one of said delay elements having an input port coupled to receive said system clock signal and outputting a replica of said system clock signal delayed by said Δt, an Nth one of said delay elements having an input port coupled to receive an output from an (N−1)th one of said delay elements and outputting a replica of said system clock signal delayed by NΔt;

(b) delaying said PLL-generated clock output signal by approximately (N/2) Δt to provide a delayed PLL-generated clock output signal;

(c) providing on said IC N two-input logic gates, each having a first input coupled to receive said delayed PLL-generated clock signal, and each having a second input coupled to receive an output of an associated said one of said delay elements;

wherein each of said two-input logic gates outputs a signal whose duty cycle is proportional to phase shift between signals present at inputs of each logic gate; and (d) examining said outputs of said two-input logic gates to determine which of said outputs has a minimum duty cycle, a minimum duty cycle output being associated with an Xth one of said two-input logic gates;

wherein a quantized measure of said φ is given by (N/2−X) Δt; and wherein a quantized measure of average maximum jitter dφ is found by examining said outputs of said two-input logic gates as a function of time.

20. The method of claim 19, wherein step (c) includes digitizing an integrated measure of said outputs of said two-input logic gates, and outputting a signal representing such a digitized integrated measure;

wherein said signal includes data reflecting said φ and said average maximum dφ.

* * * * *

UNITED STATES PATENT AND TRADEMARK OFFICE
CERTIFICATE OF CORRECTION

PATENT NO.    : 5,889,435
DATED         : March 30, 1999
INVENTOR(S) : SMITH, et al.

It is certified that error appears in the above-indentified patent and that said Letters Patent is hereby corrected as shown below:

Column 9, line 4, delete "received" and insert therefore --receive--.

Signed and Sealed this

Seventh Day of September, 1999

*Attest:*

Q. TODD DICKINSON

*Attesting Officer*     Acting Commissioner of Patents and Trademarks